United States Patent
Stark et al.

(10) Patent No.: US 12,232,671 B2
(45) Date of Patent: Feb. 25, 2025

(54) AUTOMATIC DETECTION SYSTEM FOR COMBINATION BURNISHER, POLISHER, AND SCRUBBER

(71) Applicants: DIAMOND PRODUCTIONS LTD., Montreal (CA); Eric Gallup, Rochester Hills, MI (US)

(72) Inventors: Harvey Stark, Montreal (CA); Eric Gallup, Rochester Hills, MI (US); Isaac Branning, Arcola, IN (US); Pavel Ikonomov, Laval (CA)

(73) Assignee: DIAMOND PRODUCTIONS LTD., Montreal (CA)

( * ) Notice: Subject to any disclaimer, the term of this patent is extended or adjusted under 35 U.S.C. 154(b) by 499 days.

(21) Appl. No.: 17/694,357

(22) Filed: Mar. 14, 2022

(65) Prior Publication Data

US 2023/0131689 A1    Apr. 27, 2023

Related U.S. Application Data

(63) Continuation-in-part of application No. 17/507,995, filed on Oct. 22, 2021, now Pat. No. 11,969,127.

(51) Int. Cl.
| | | |
|---|---|---|
| *A47L 11/40* | (2006.01) | |
| *A47L 11/14* | (2006.01) | |
| *A47L 11/282* | (2006.01) | |
| *G01R 15/20* | (2006.01) | |

(Continued)

(52) U.S. Cl.
CPC .......... *A47L 11/4069* (2013.01); *A47L 11/14* (2013.01); *A47L 11/282* (2013.01); *A47L 11/4038* (2013.01); *G01R 15/202* (2013.01); *G01R 19/0084* (2013.01); *H02K 7/14* (2013.01); *A47L 11/4011* (2013.01)

(58) Field of Classification Search
CPC .... A47L 11/4069; A47L 11/14; A47L 11/282; A47L 11/4038; A47L 11/4011; A47L 11/283; G01R 15/202; G01R 19/0084; H02K 7/14; B24D 13/20; B24B 41/047; B24B 47/12; B24B 7/186; B24B 49/10
USPC ............................................. 324/251, 207.2
See application file for complete search history.

(56) References Cited

U.S. PATENT DOCUMENTS

| | | |
|---|---|---|
| 4,050,003 A | 9/1977 | Owings et al. |
| 4,590,635 A * | 5/1986 | Tucker ................ A47L 11/4069 318/434 |
| 4,731,956 A | 3/1988 | Wood |

(Continued)

FOREIGN PATENT DOCUMENTS

CN    109330504 A  *  2/2019  ............ A47L 11/28

OTHER PUBLICATIONS

James Wade, The ultimate scrubber showdown:pads vs brushes, May 31, 2016, Rhiel Supply, pp. 1-2 (Year: 2016).

(Continued)

*Primary Examiner* — Tung X Nguyen
*Assistant Examiner* — Robert P Alejnikov, Jr.
(74) *Attorney, Agent, or Firm* — Bradley J. Thorson; DeWitt LLP

(57) ABSTRACT

Multiple floor treatment operations, such as burnishing, polishing, and scrubbing, may be performed using a single floor treatment machine having a motor, the speed of which is governed by a controller that responses to sensor signals indicative of the type of floor treatments pad or pads operatively coupled to the motor.

10 Claims, 12 Drawing Sheets

(51) Int. Cl.
  *G01R 19/00* (2006.01)
  *H02K 7/14* (2006.01)

(56) References Cited

U.S. PATENT DOCUMENTS

| | | | |
|---|---|---|---|
| 5,524,320 | A | 6/1996 | Zachhuber |
| 6,017,354 | A * | 1/2000 | Culp ............... A61B 17/1626 604/22 |
| 6,530,821 | B2 | 3/2003 | Legatt et al. |
| 7,963,823 | B2 | 6/2011 | Fischer |
| 8,024,995 | B2 | 9/2011 | Dayton et al. |
| 8,771,794 | B2 * | 7/2014 | Pollack ............... A47L 11/4058 427/322 |
| 9,089,686 | B2 | 7/2015 | Iwen et al. |
| 9,256,988 | B2 | 2/2016 | Wenger et al. |
| 9,265,396 | B1 | 2/2016 | Lu et al. |
| 9,565,984 | B2 | 2/2017 | Lu et al. |
| 9,713,509 | B2 | 7/2017 | Schuh et al. |
| 10,004,517 | B2 * | 6/2018 | Philipp ............ B01F 33/50115 |
| 10,016,199 | B2 * | 7/2018 | Baber ..................... H02H 1/06 |
| 10,952,585 | B2 | 3/2021 | Lu et al. |
| 11,571,104 | B2 | 2/2023 | Williams |
| 2006/0179599 | A1 | 8/2006 | Miner |
| 2008/0004743 | A1 | 1/2008 | Goers et al. |
| 2008/0189870 | A1 | 8/2008 | Dayton et al. |
| 2013/0185012 | A1 | 7/2013 | Yamamoto |
| 2015/0032259 | A1 | 1/2015 | Kim |
| 2015/0160268 | A1 * | 6/2015 | Juds ..................... G01R 33/07 324/251 |
| 2016/0270618 | A1 | 9/2016 | Lu |
| 2016/0270619 | A1 | 9/2016 | Lu |
| 2017/0332850 | A1 | 11/2017 | Powell |
| 2019/0101872 | A1 | 4/2019 | Li |
| 2020/0170473 | A1 * | 6/2020 | Reimels ............. A47L 11/4036 |
| 2021/0159829 | A1 * | 5/2021 | Jian ..................... H02P 21/16 |

OTHER PUBLICATIONS

Ewbank, Ewbank EP170 All-In-One Floor Cleaner, Scrubber and Polisher, Red Finish, 23-Foot Power Cord, Aug. 15, 2013 (Year: 2013).

Heason, Slip Ring Function, Sep. 6, 2021, Verto, pp. 1-2 (Year: 2021).

Kubler, Slip Rings manual SR060E, Jun. 2020, Fritz Kubler GmbH, pp. 1-2 (Year: 2020).

* cited by examiner

AUTOMATIC DETECTION SYSTEM FOR COMBINATION BURNISHER, POLISHER, AND SCRUBBER

CROSS-REFERENCED TO RELATED APPLICATIONS

This is a continuation-in-part of U.S. patent application Ser. No. 17/507,995 filed Oct. 22, 2021, by Stark et al and entitled "Automatic Detection System for Combination Burnisher, Polisher, and Scrubber".

STATEMENT REGARDING FEDERALLY SPONSORED RESEARCH OR DEVELOPMENT

None

BACKGROUND OF THE INVENTION

I. Field of the Invention

This invention relates generally to motor powered floor finishing machines and, more particularly, to a single machine motor powered floor finishing machine capable of being alternatively used for either burnishing, scrubbing and polishing and employing a mechanism for automatically detecting whether a burnishing, scrubbing or polishing pad is attached to the machine and appropriately adjusting the speed at which the pad rotates based on the type of pad attached to the machine.

II. Discussion of the Prior Art

The prior art includes many patents and publications describing tools for polishing, scrubbing and burnishing floors. Such machines typically carry one or more rotatably mounted, motor driven drive plates that, in turn, carry one or more pads attachable to the motor driven drive plate and adapted to be rotated in relation to a floor surface. Earlier example of such machines are shown in U.S. Pat. No. 4,731,956 to David W. Wood granted Mar. 22, 1988, U.S. Pat. No. 5,524,320 granted to Kurt Zachhuber on Jun. 11, 1996, and U.S. Pat. No. 6,530,821 granted to Legatt et al. on Mar. 11, 2003.

The prior art machines described in the references cited above each employ at least one circular disc and a mechanism for rotating the disk at a desired speed. Attached to the floor facing surface of the disks is a pad having a substantially planar floor-engaging surface. While such machines perform well, the efficacy of the machine is dependent on the type of pad attached to the disk and the speed of rotation of the disk. In each case, the desired cleaning, polishing or burnishing action will not occur if the speed is too slow, and the pad will quickly be destroyed if the speed is too high. To prevent premature pad destruction, the speed of rotation of the disk and pad on a dedicated scrubbing machine is typically limited to three hundred revolutions per minute. The speed of rotation of the disk and pad on a dedicated polishing machine is typically limited to six hundred revolutions per minute. The speed of rotation of the disk and pad on a dedicated burnishing machine is typically limited to twelve hundred revolutions per minute. Other types of pads, e.g., sanding and grinding pads may also be attached to such machine which preferably will operate at rotational speeds either higher or lower than those specifically referenced above.

The purpose of the present invention is to provide a mechanism by which the machine can automatically (a) detect which type of pad is attached to the machine, and (b) adjust the maximum speed at which the disk will rotate based on the type of pad detected.

SUMMARY OF THE INVENTION

In accordance with the present invention, a floor treating machine comprises a chassis adapted to be moved along the floor and a variable speed motor. A controller is also provided to control the speed of the motor. A drive is driven by the variable speed motor. The drive is coupled to one or more plates each having a pad of a preselected type attached thereto. The drive is adapted to rotate the plates. The pad can be a scrubber pad, a polishing pad, a burnishing pad, a grinding pad, or any other type of pad that may be useful to treat a floor.

Significantly, the present invention further comprises elements that are used to automatically control the maximum speed at which the motor and drive rotate the plate based on the type of pad currently attached to the plate. These elements include an indicator member identifying the type of pad attached to the plate. These elements also include a sensor adapted to interact with the indicator member and send a signal to the controller indicative of the type of pad attached to the plate. The controller adjusts the maximum speed at which the variable speed motor (and thus the drive) operates based on signals received from the sensor.

Various types of indicators and sensors may be used. In some embodiments, the indicator member may be a radio frequency identification (RFID) tag adapted to send a radio frequency signal indicative of the type of pad attached to the plate, and sensor is one adapted to receive said radio frequency signals from the RFID tag and deliver a corresponding signal to the controller.

In other embodiments, the sensor is adapted to read a code located on a surface of the plate. The code may be stamped, engraved, etched, or printed on the plate. The code may also be on a separate label or tag affixed to the plate with rivets, an adhesive, or any other suitable mechanism. Such code may be a bar code, postnet code, QR code, data matrix code, color code, or any other code adapted to be read by the sensor and thereby uniquely identify the type of pad attached to the plate. In still other embodiments, the sensor may be a magnetic sensor, such as a Hall sensor, and the indicator a set of magnets coupled to the plate.

Given the environmental conditions in which the sensor and indicator must operate, using a slip ring sensor adapted to send signals to the controller offers certain advantages. A slip ring sensor may be coupled to a drive shaft of the drive so that the slip ring sensor rotates with the drive shaft. A plurality of electrodes may be coupled to the slip ring sensor. Each such electrode includes a separate electrical contact coupled to the drive shaft. The indicator includes a unique set of keys coupled to the plate. The preselected number of keys included in the unique set of keys corresponds to the type of pad also coupled to the plate. By way of example and without limitations, if the preselected number of keys in the unique set is zero the pad is a scrubbing pad, if the preselected number of keys in the unique set is one the pad is a polishing pad, and if the preselected number of keys in the unique set is two the pad is a burnishing pad. The unique set of keys will include a different number of keys for each different type of pad that may be employed. Likewise, the number of electrodes attached to the slip ring sensor and drive shaft will correspond to the largest number of keys found in any of the unique sets of keys used to identify the pads.

When a slip ring senor is employed with such key style indicators, the keys of the unique set of keys engage a corresponding number of electrical contacts. The slip ring sensor thereby identifies the unique set of keys indicative of the type of pad attached to the plate and sends signals to the controller. In response, the controller adjusts the maximum speed at which the variable speed motor operates based on signals received from the slip ring sensor. Again, by way of example and without limitation, if the preselected number of keys detected is zero the maximum revolutions per minute of the drive shaft may be three hundred, if the preselected number of keys detected is one the maximum revolutions per minute of the drive shaft may be six hundred, and if the preselected number of keys detected is two the maximum revolutions per minute of the drive shaft may be twelve hundred. Additional numbers of keys detected may result in a different maximum of revolutions per minute. The controller is programmed to correlate specific maximum numbers of revolutions per minute with specific numbers of keys, and the keys coupled to the disk should likewise correlate to the type of pad attached to the disk and the desired maximum revolutions per minute that the pad can handle without undue premature damage to the pad.

BRIEF DESCRIPTION OF THE DRAWINGS

The foregoing features, objects and advantages of the invention will become apparent to those skilled in the art from the following detailed description of a preferred embodiment, especially when considered in conjunction with the accompanying drawings in which like numerals in the several views refer to corresponding parts.

DESCRIPTION OF THE PREFERRED EMBODIMENT

Figure 1:
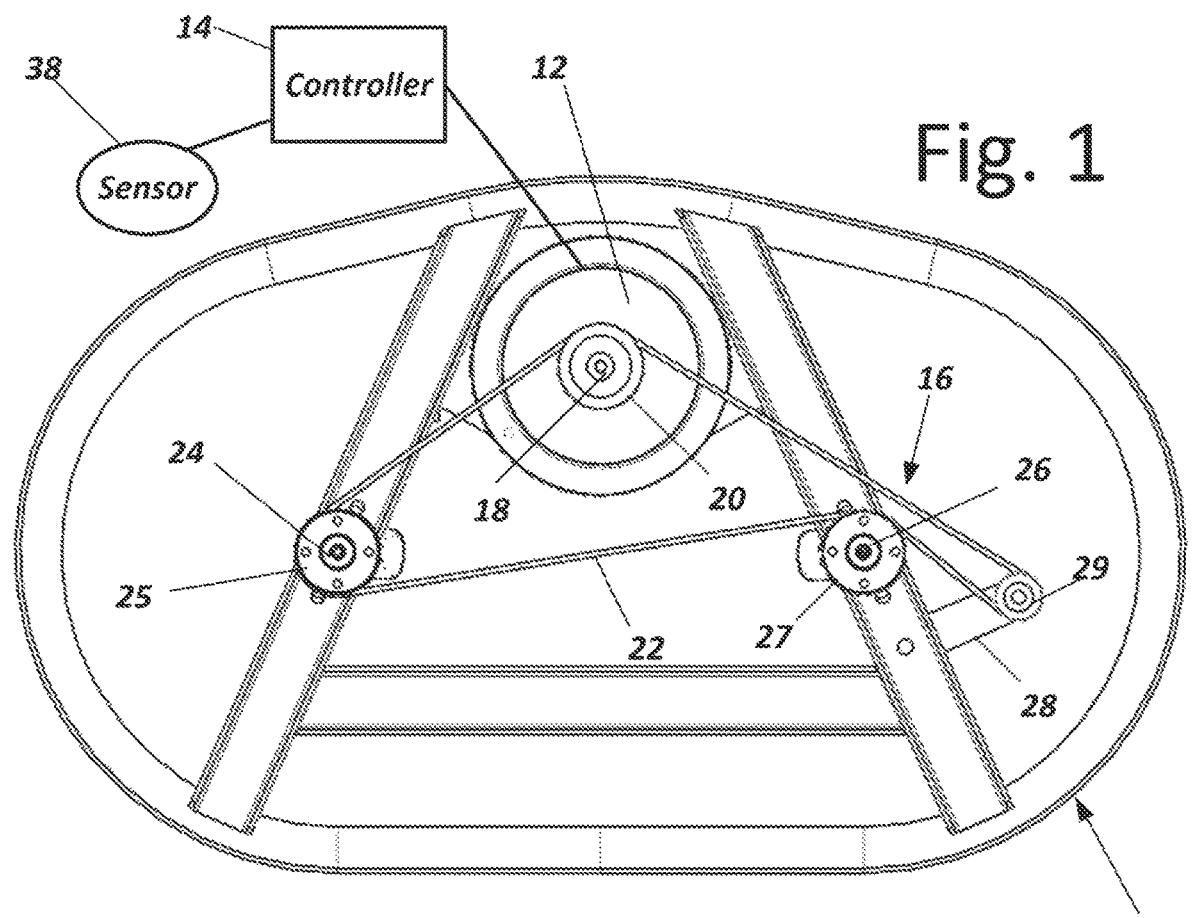
FIG. 1 is a bottom plan view showing the chassis and drive of a floor treating machine.
Figure 2:
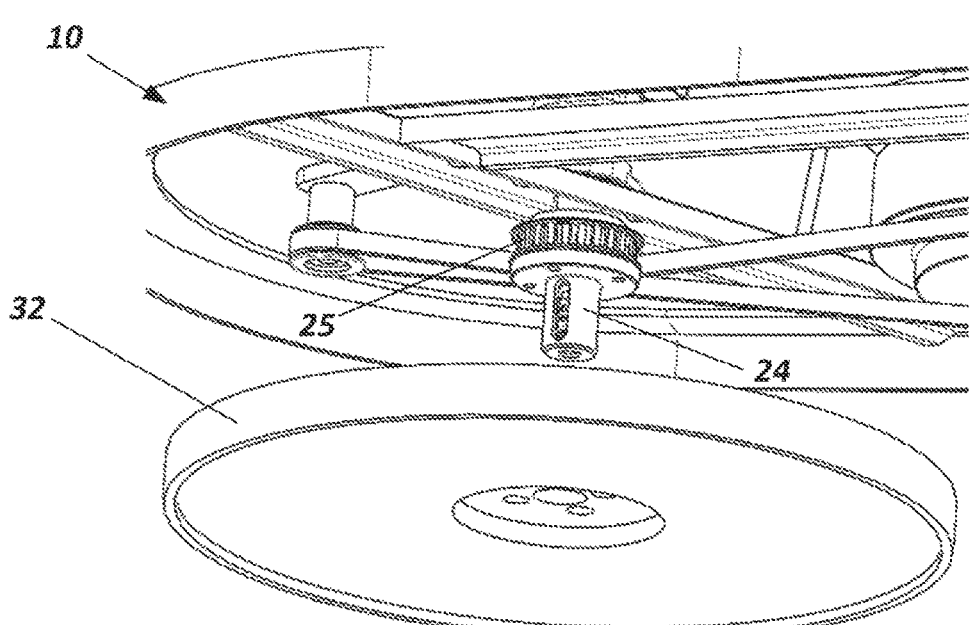
FIG. 2 is an exploded, partial perspective view of a portion chassis and drive of FIG. 1.

The description of the preferred embodiment is intended to be read in connection with the accompanying drawings, which are to be considered part of the entire written description of this invention. In the description, relative terms such as "lower", "upper", "horizontal", "vertical", "above", "below", "up", "down", "top", and "bottom", as well as derivatives thereof (e.g., "horizontally", "downwardly", "upwardly", etc.), should be construed to refer to the orientation as then described or as shown in the drawings under discussion. These relative terms are for the convenience of description and do not require that the apparatus be constructed or operated in a particular orientation. Terms, such as "connected", "connecting", "attached", "attaching", "join", and "joining", are used interchangeably and refer to one structure or surface being secured to another structure or surface or integrally fabricated in one piece, unless expressly described otherwise. As used herein, the term "floor treating machine" is meant to include floor grinding, floor polishing, floor burnishing, floor scrubbing and swing machines, and more specifically, machines adapted to perform each of these functions depending on the type of pad attached to the machine.

Referring to FIG. 1, a floor treating machine comprising a chassis 10 adapted to be moved along the floor is shown. Coupled to the chassis 10 is a variable speed motor 12. The variable speed motor 12 may be of any suitable type such as an electric motor or a hydraulic motor. A controller 14 (see FIG. 1) is also provided to control the speed of the variable speed motor 12.

Figure 3:
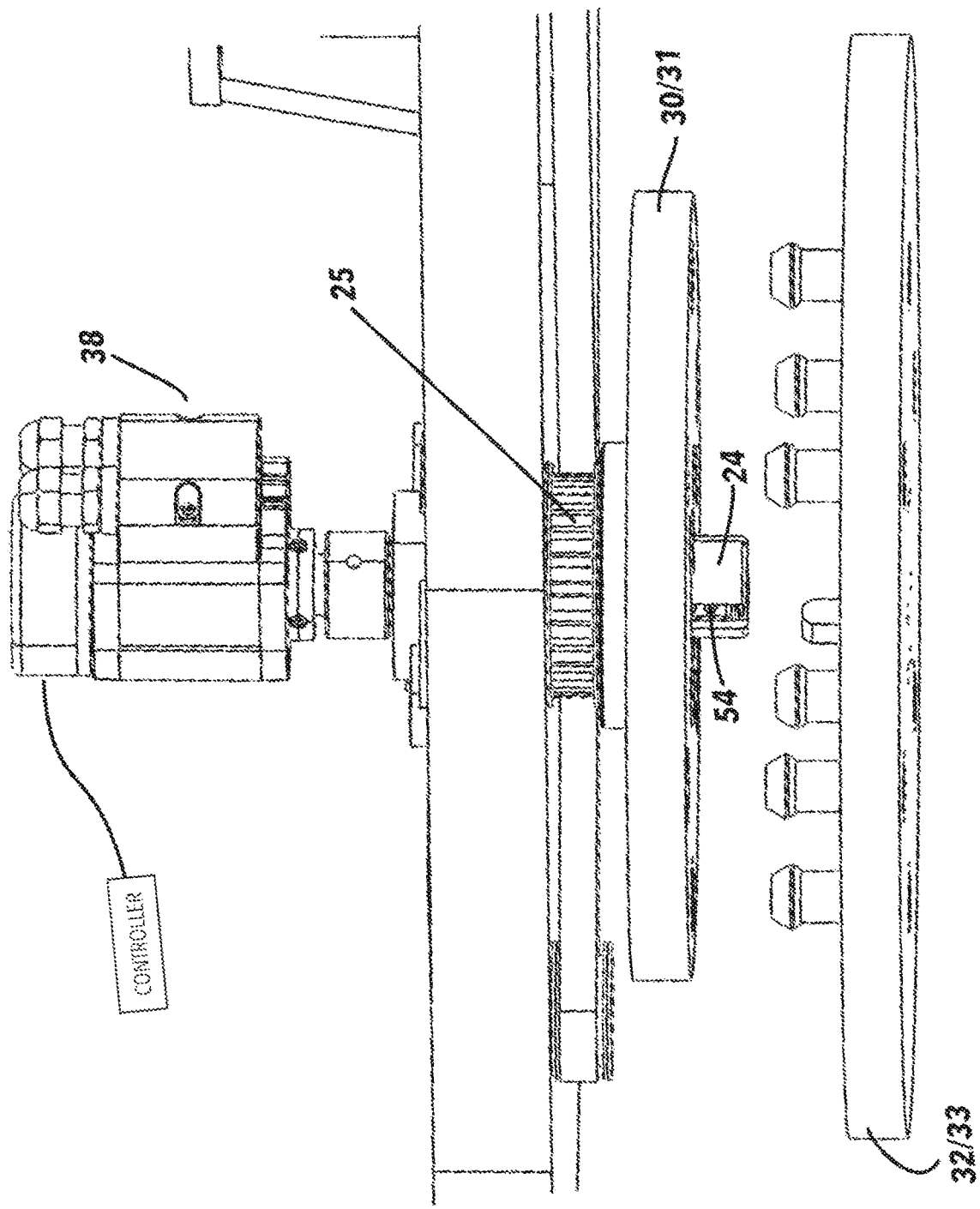
FIG. 3 is a view of a drive assembly of a floor finishing machine incorporating a preferred embodiment of the present invention.

A drive 16 is driven by the variable speed motor 12. Any suitable drive may be used. As shown in FIG. 1, the drive 16 here includes a first shaft 18 of the motor 12 and is adapted to be rotated by the motor. Attached to the shaft 18 is a first cog or timing pulley 20. The drive 16 also includes a notched timing belt 22 and two drive shafts 24/26 each rotatably journaled for rotation by bearings to the chassis 10. Each of the two drive shafts 24/26 has a pulley 25/27 attached thereto. The drive 16 may also include a tensioner 28 with its own pulley 29. The drive may also comprise connector disks 30/31 such as is illustrated in FIG. 3. From FIG. 1, one skilled in the art will appreciate that when the belt 22 is wrapped around pulleys 20, 25, 27, and 29 and the motor 12 is running, the drive shafts 24 and 26 with spin at revolutions per minute corresponding to the speed at which shaft 18 is being rotated by the motor 12. Alternative drives used to drive a single drive shaft or a plurality of drive shafts may be used without deviating from the invention.

A shown in FIG. 3, a pair of plates 32/33 are adapted to be coupled individually to the drive shafts 24 and 26 of FIG. 1 via the connector disks 30/31. When so coupled, the plates 32/33 will rotate together with the drive shafts 24 and 26. Any of a variety of different style pads may individually be attached to the plates 32/33. The pads may be configured for floor grinding, floor polishing, floor burnishing, floor scrubbing, or any other desired floor treatment operation.

Significantly, the present invention further comprises machine elements that are used to automatically control the maximum speed at which the motor and drive rotate the plates 32/33 based on the type of pad attached to the plates.

These machine elements include the controller 14 that sends control signals to the motor 12 to regulate its maximum speed of operation based on signals that the controller receives from at least on sensor 38. These elements also include an indicator member 40 identifying the type of pad attached to the plate. The indicator members 40 may take various forms. Indicator members 40 may be radio frequency identification (RFID) tag either mounted to or embedded within or on the plates 32/33. When the indicator members 40 are RFID tags, the sensor(s) 38 are adapted to receive radio frequency signals from the RFID tag and deliver a corresponding signal to the controller 14.

Likewise, the indicator members may be a set of magnets, said set consisting of 0, 1, 2, 3, or more magnets, positioned about the plates 32/33 either on surfaces of those plates or embedded within such plates. When the indicator members 40 are such a set of magnets, the sensor(s) 38 are magnetic sensors adapted to detect differences in the shape or intensity of the magnetic field generated by the magnets. This arrangement is more specifically shown in FIGS. 13 through 17.

Figure 13:
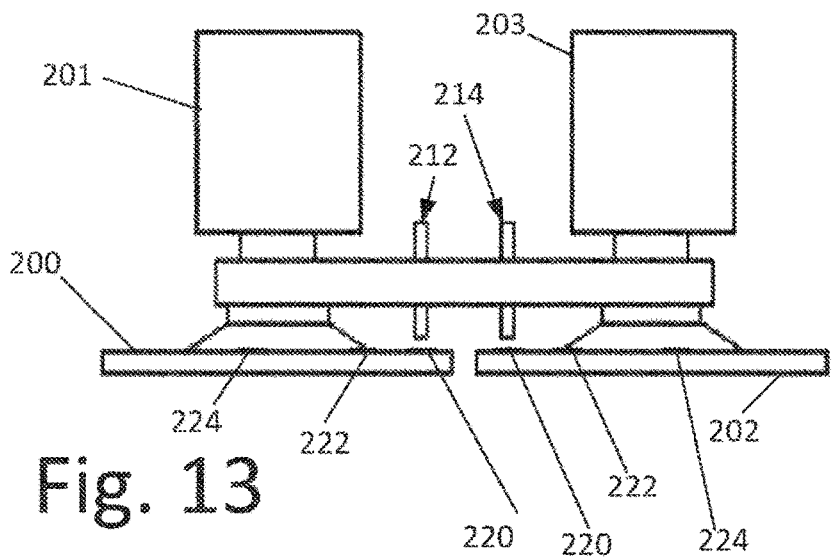
FIG. 13 is a first schematic diagram showing a second embodiment made in accordance with the present invention.

As shown in FIG. 13, the machine has two disks 200 and 202 rotated by separate motors 201 and 203 such that each disk 200/202 rotates at a variable speed between 300 revolutions per minute and 1200 revolutions per minute. Motor 201 rotates disk 200 in a clockwise direction while motor 203 rotates disk 202 in a counterclockwise direction.

Figure 14:
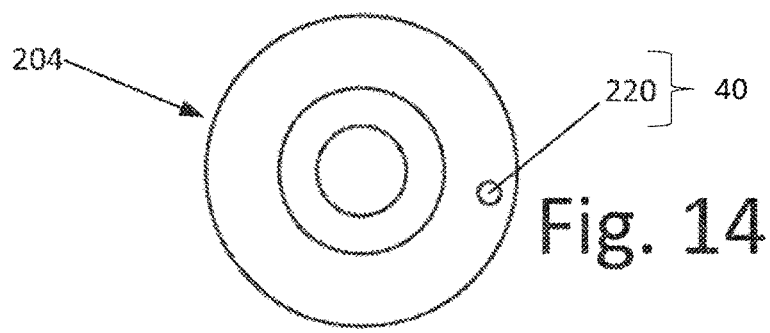
FIG. 14 is a plan view of a first type of disk adapted for use in connection with the embodiment of FIG. 13.
Figure 15:
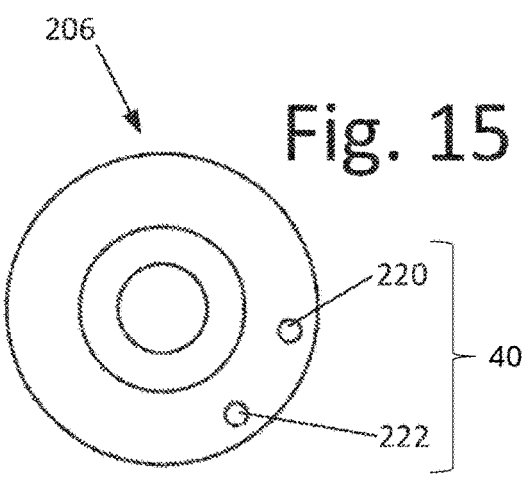
FIG. 15 is a is a plan view of a second type of disk adapted for use in connection with the embodiment of FIG. 13.
Figure 16:
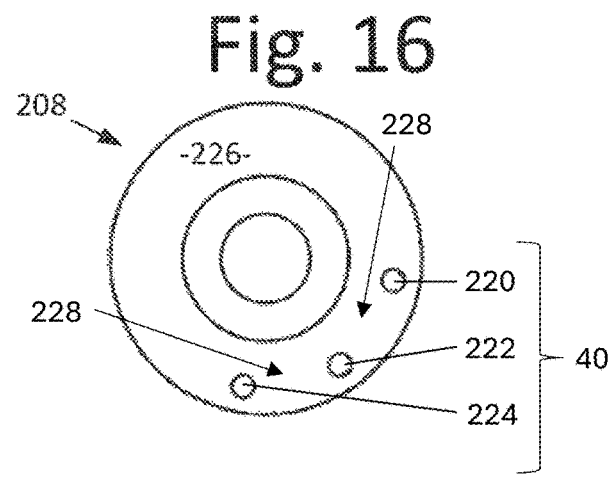
FIG. 16 is a plan view of a third type of disk adapted for use in connection with the embodiment of FIG. 13.
Figure 17:
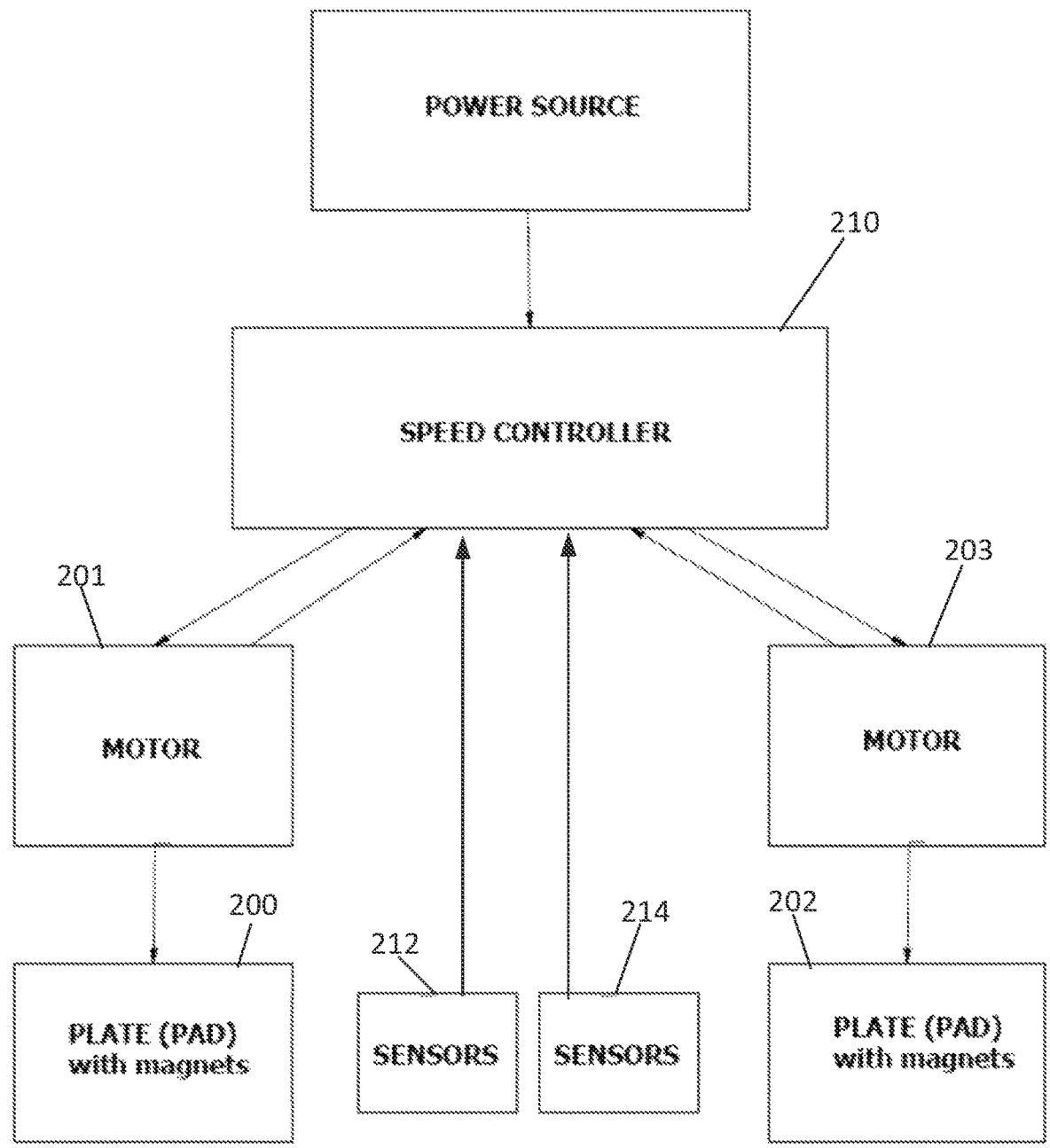
FIG. 17 is a second schematic diagram of the embodiment of FIG. 13.

The disks 200 and 202 mounted to the machine are each of the same type, but different types of disks are available. A specific number of magnets are couple to the disks 200/202 based on the disk's type. As shown in FIGS. 14-16, a first type of disk 204 includes a single magnet 220, second type of disk 206 includes two magnets 220 and 222, and a third type of disk 208 includes three magnets 220, 222, and 224. A fourth type of disk can be provided with no magnet, and additional disk types can be provided with more than three magnets. In each case where multiple magnets are employed on the disk the magnets are ideally arranged with single long interval 226 between the end magnets (e.g., magnets 220 and 224 in FIG. 16) and shorter intervals 228 between the end magnets and the intervening magnets.

The maximum speed of the motors 201 and 203 are governed by the type of disks (i.e., the number of magnets on the disks) coupled to the machine. More specifically, the maximum speed is governed by a controller 210 that receives voltage signals from a pair of Hall sensors 212 and 214. The output voltage of each of the Hall sensors 212 and 214 is directly proportional to the strength of the magnetic field generated by the magnets on the disks. One advantage of this arrangement is that the controller 210 receives different voltages from the two Hall sensors 212 and 214, the controller 210 is adapted to shut down the motors and send a signal to the operator indicating that the disks do not match, i.e., are not of the same type. The operator must take steps to ensure the disks 200 and 202 match before the motors will turn the disks.

The indicator members 40 may also be codes on the surfaces of the plates 32/33. The codes may be stamped, engraved, etched, printed on the plates 32/33. The codes may also be on a separate labels or tags affixed to such plates with rivets, an adhesive, or any other suitable mechanism. Such codes may be a bar code, postnet code, QR code, data matrix code, color code, or any other code adapted to be read by a sensor 38 and thereby uniquely identify the type of pad attached to the plate.

Figure 9:
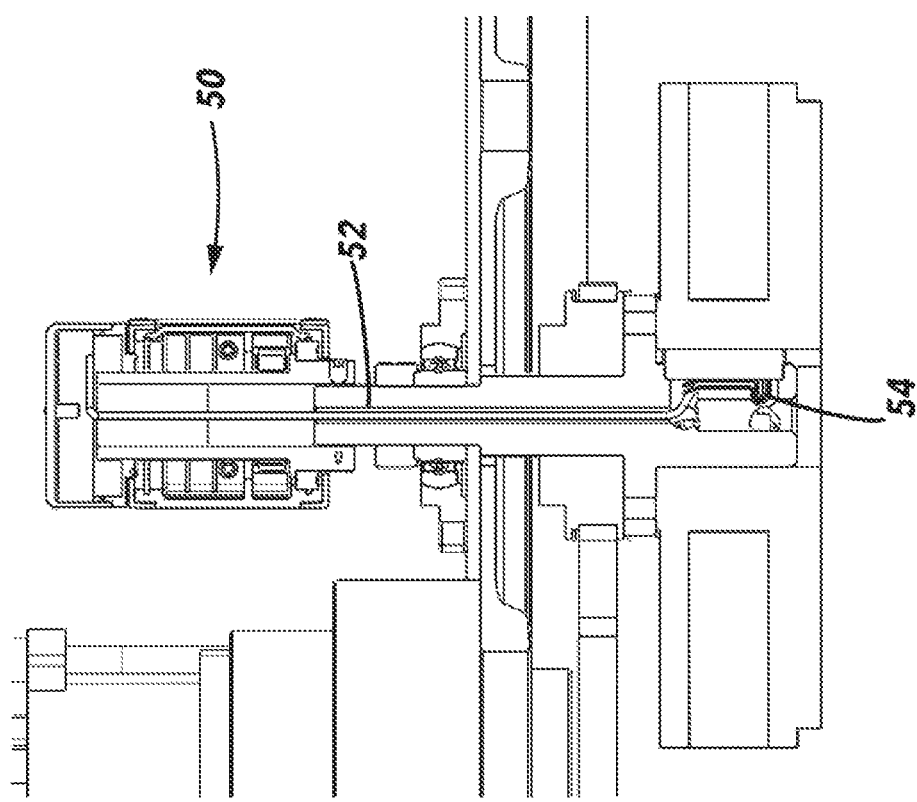
FIG. 9 is a cross sectional view showing a slip ring sensor employed as the sensor.
Figure 10:
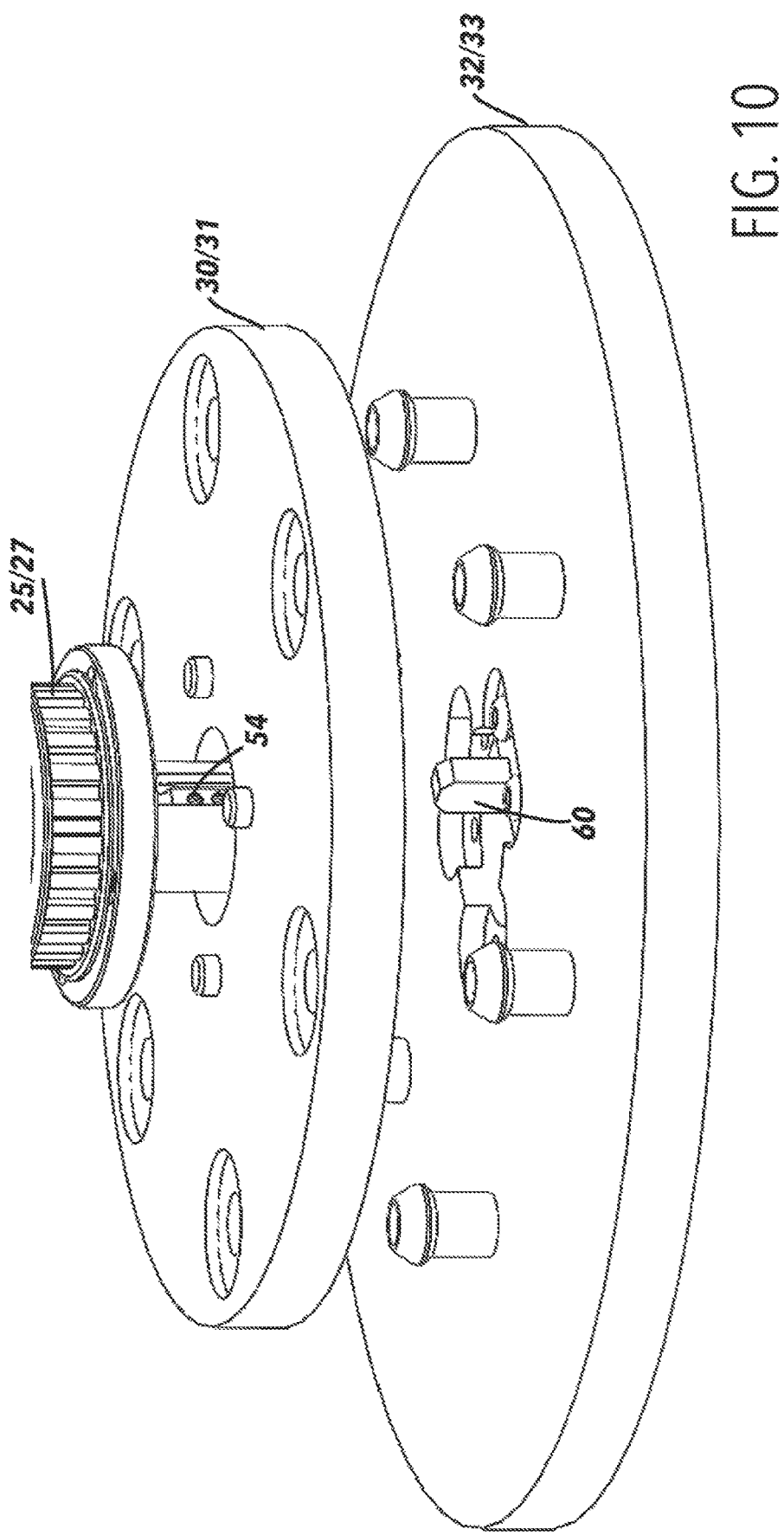
FIG. 10 is a perspective view showing the connecting disk aligned with a pad plate for attachment.
Figure 11:
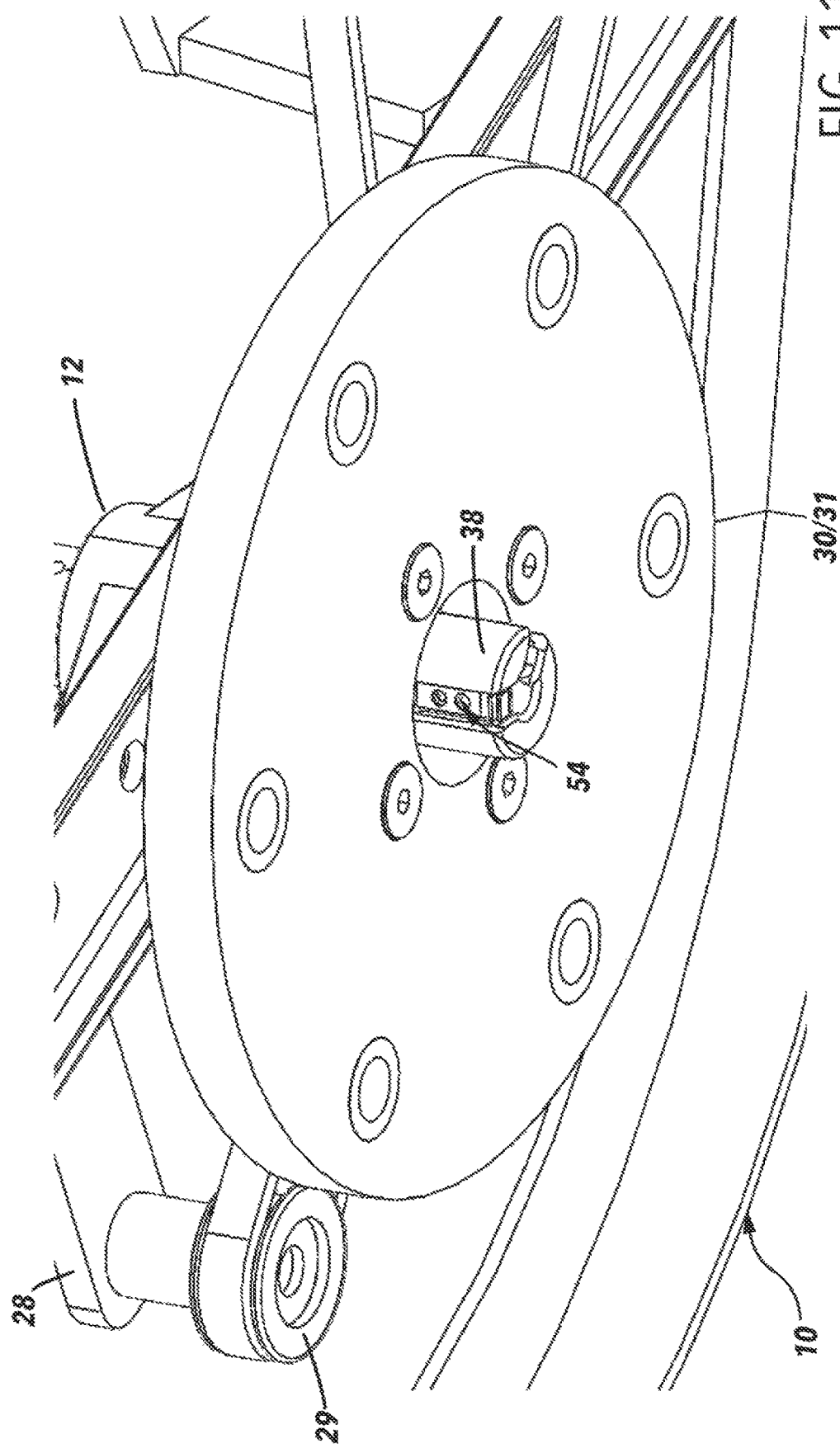
FIG. 11 shows the connecting plate of FIG. 10 coupled to the pulley and drive shaft.
Figure 12:
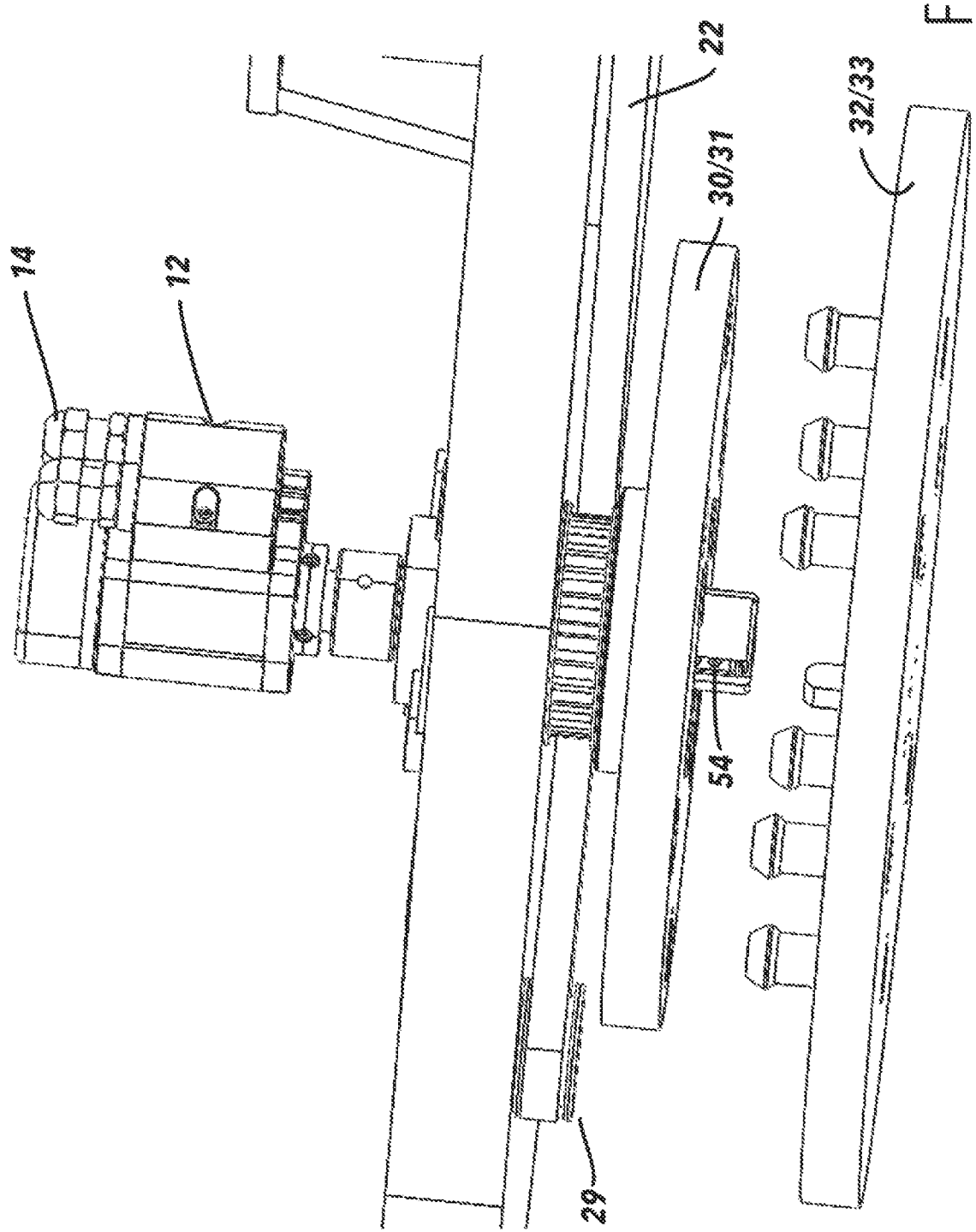
FIG. 12 is a perspective view showing a pad plate aligned for attachment to a connecting disk.

Given the environmental conditions in which the sensors and indicator members must operate, using a slip ring sensor 50 (FIG. 9) adapted to send signals to the controller 14 offers certain advantages. An example of such a slip ring sensor is the model SR060E slip ring sensor manufactured by Kuebler, Inc. of Charlotte, North Carolina Slip ring sensor 50 is coupled to a drive shaft 24/26 of the drive 16 so that the slip ring sensor 50 rotates with the drive shafts 24/26. A plurality of electrodes 52 are coupled to the slip ring sensor 50. Each such electrode 52 included a separate electrical contact 54 attached to the drive shaft 24/26 at the location where the individual plates 32/33 are mounted to the drive shaft via the connection disks 30/31. The electrical contacts 54 are adapted to provide a circuit closed between them when engaged by one of the keys 60 described below.

As mentioned above, a separate slip ring sensor 50 and set of electrodes may be coupled to each of the drive shafts of the drive 16. Others may find this unnecessary and only incorporate one such slip ring sensor 50 when it is known that each pad is the same.

When slip ring sensor(s) 50 are employed, the indicator 40 includes a unique set of keys 60 coupled to the plate(s) 32/33. The preselected number of keys included in the unique set of keys corresponds to the type of pad also coupled to the plate 32/33 and the drive shaft 24/25 via the connection disks 30/31. The type of keys employed will depend on the type of electrical contacts used. For example, the electrical contacts 54 could simply be encapsulated switches adapted to be closed by the forces associated with physically engaging a key. The contacts 54 may also be in the form of a pair of posts or plates as part of a circuit closed by encountering a key that is conductive. The electrical contacts 54 may also be reed switches that are closed when proximate to a key that is magnetic. The contacts 54 can take other forms without deviating from the invention.

Figure 4:
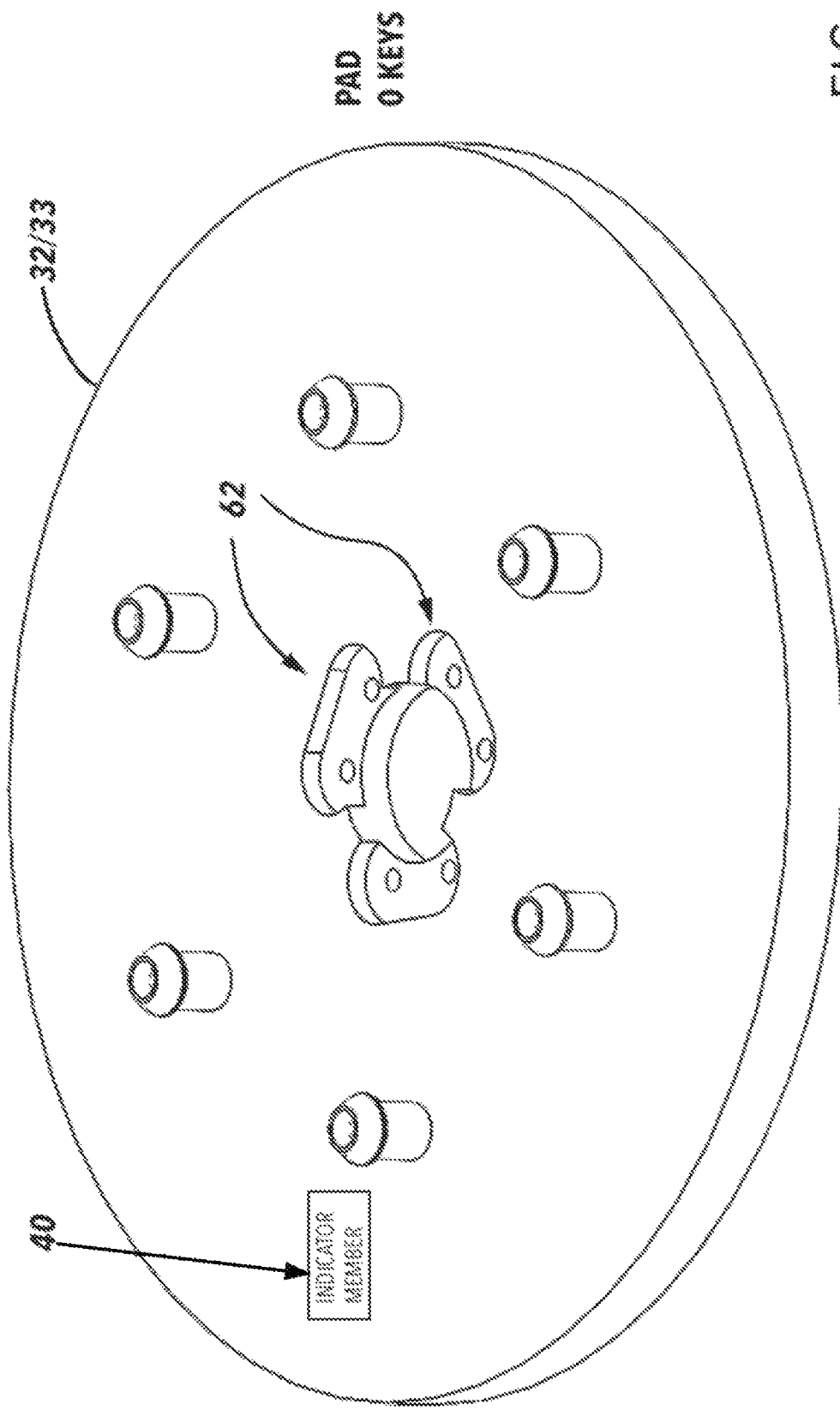
FIG. 4 is a perspective view from above of a floor treatment pad with a key arrangement.
Figure 5:
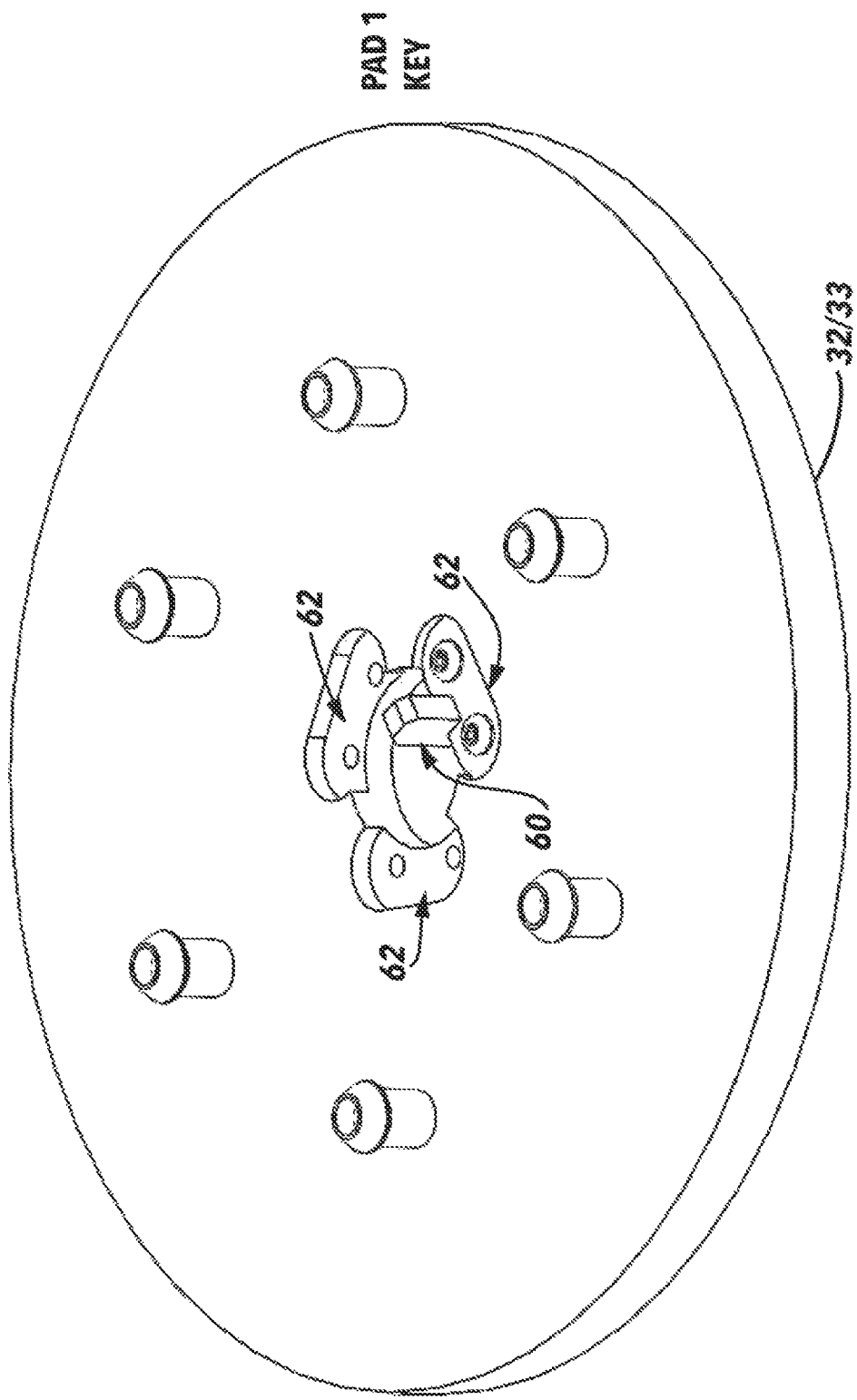
FIG. 5 is a perspective view form above of a floor treatment whose key arrangement differs from that of FIG. 4.
Figure 6:
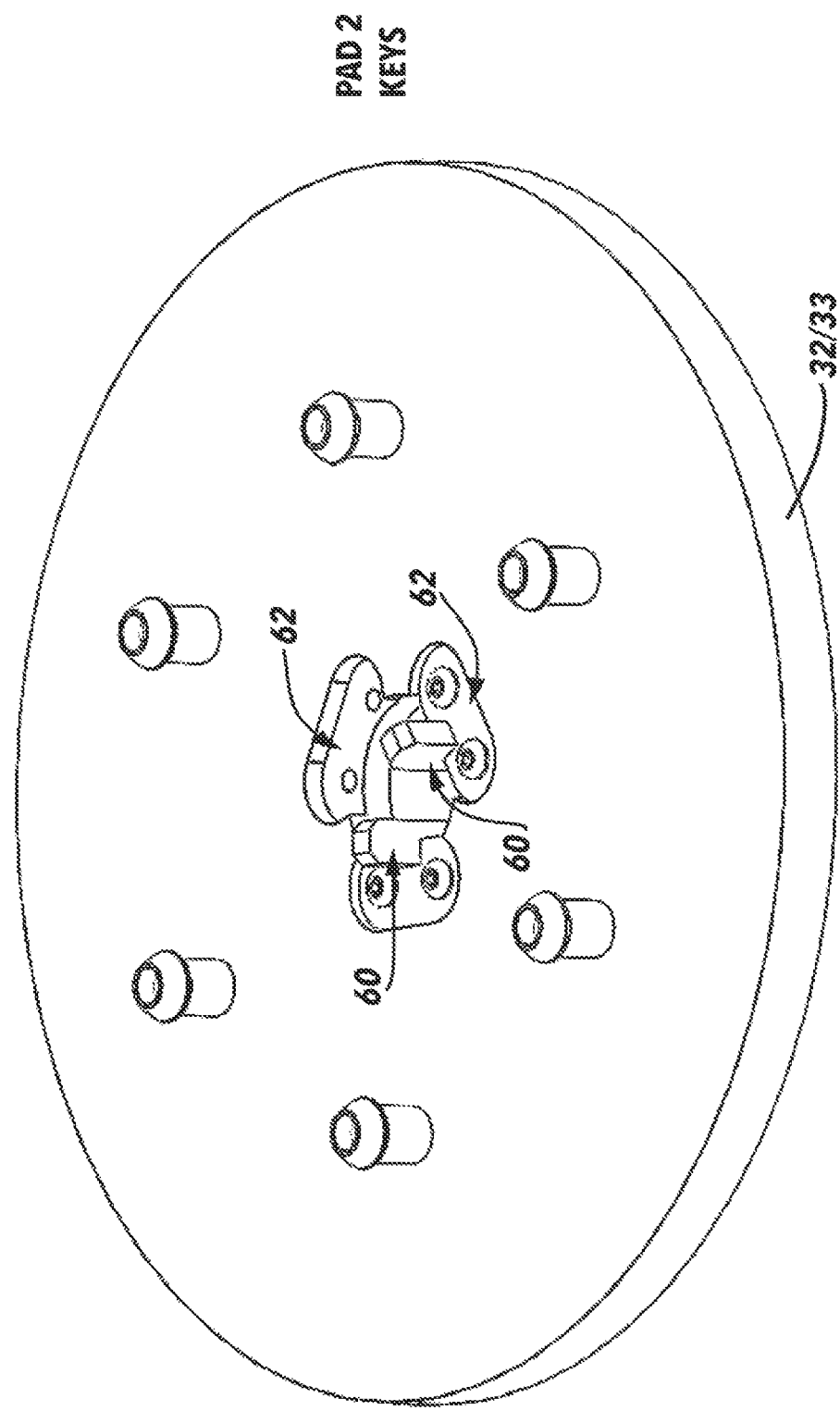
FIG. 6 is a view like that of FIGS. 4 and 5, but with a different key arrangement.
Figure 7:
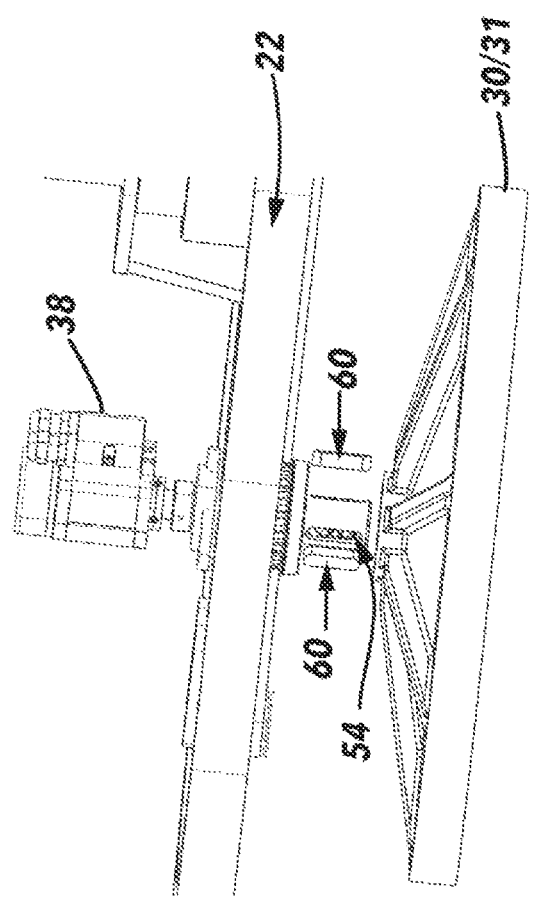
FIG. 7 is a perspective view showing the use of an alternative connecting disk.
Figure 8:
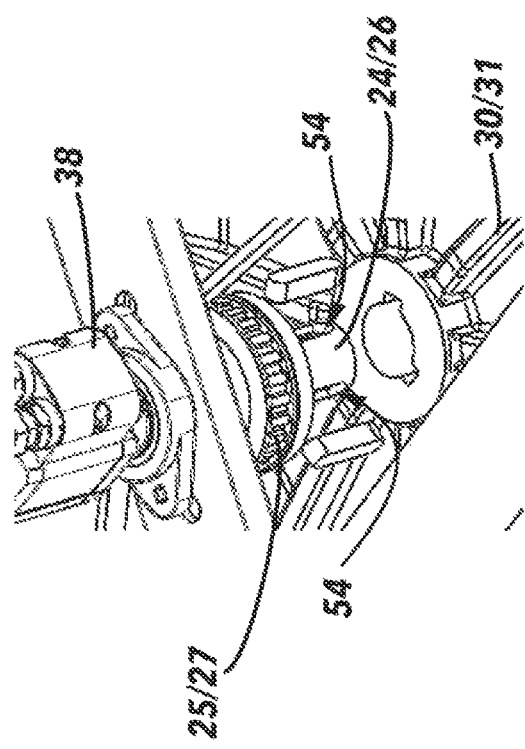
FIG. 8 is a perspective view showing how the alternative connecting disk may be attached to the drive shaft.

FIGS. 4 through 6 provide an example of a system that can accommodate and identify four different types of pads. In this example, the set of keys attached to the plate can include zero keys (see FIG. 4), one key 60 (see FIG. 5), two keys 60 (see FIG. 6) or four keys. This is because the plates 32/33 have three key slots 62. Plates with a fewer or greater number of key slots may be used without deviating from the invention. The number of key slots and thus the number of unique sets of keys per key slot that can be employed will depend on the number of different types of pads intended for use with the machine.

In the example provided by FIGS. 4 through 6, three different types of pads are employed, scrubbing pads, polishing pads, and burnishing pads. As shown in FIG. 4, none of the key slots 62 of the plate are filled with keys 60 when a scrubbing pad is attached to the plate. As shown in FIG. 5, one of the key slots 62 of the plate are filled with a key 60 when a polishing pad is attached to the plate. As shown in FIG. 6, two of the key slots 62 of the plate are filled with keys 60 when a burnishing pad is attached to the plate.

Likewise, the number of electrodes 52 (see FIG. 9) attached to the slip ring sensor 50 and drive shafts 24/26 will correspond to the number of key slots 62 found in the plate 32/33 and thus the maximum number of keys 60 that may be attached to the plate 32/33.

When the pad plates of FIGS. 4-6 are used, a pad is secured to the floor facing surface of a plate. A set of keys 60, including the number of keys 60 corresponding to the type of pad, is also coupled to the plate 32/33 so that the number of keys 60 identifies the type of pad. Of course, the plate 32/33 and pad assembly may be prefabricated at a factory. In the factory, different mold inserts can be used to fabricate plates with zero, one, two, or more key slots and keys and those plates can be coupled to the type of pad corresponding to the number of keys. In either case, the plate 32/33 can then be coupled to a drive shaft 24/26 and the set of keys 60 associated with the plate 30/31 will engage a corresponding number of electrical contacts 54. The slip ring sensor 50 thereby identifies the unique set of keys 60 indicative of the type of pad attached to the plate 32/33 and send signals to the controller 14. The controller 14 responds by adjusting the maximum speed at which the variable speed motor 12 operates based on signals received from the slip ring sensor 50.

Again, by way of example and without limitation, if the preselected number of keys 60 detected is zero, the controller 36 will control the variable speed motor 12 to limit the maximum revolutions per minute of the drive shaft 24/26 to three hundred. If the preselected number of keys 60 detected is one, the controller 36 will control the variable speed motor 12 to limit the maximum revolutions per minute of the drive shaft 24/26 to six hundred. If the preselected number of keys 60 detected is two, the controller 36 will control the variable speed motor 12 to limit the maximum revolutions per minute of the drive shaft 24/26 to twelve hundred. Additional numbers of keys detected may result in a different maximum revolutions per minute.

The controller will need to be programmed to correlate specific maximum numbers of revolutions per minute with specific numbers of keys, and the keys coupled to the disk should likewise correlate to the type of pad attached to the disk and the desired maximum revolutions per minute that the pad can handle without undue premature damage to the pad.

As briefly noted above, a single slip ring sensor 50 may be employed or separate slip ring sensors may be coupled to each drive shaft. The advantage of using one slip ring sensor is reduced cost. The advantage of using a separate slip ring sensor on each shaft is that doing so allows the controller 36 to identify whether the pads coupled to the machine are all the same type. If the controller identifies any mismatch, the controller can respond by limiting the speed, delivering some warning such as illuminating a warning light, preventing operation of the machine or any combination of these or other responses.

An alternative connector assembly for coupling the plates and pads to the drive may be provided. Here a pulley may be provided with a drive shaft and a coupling means for connecting the pulley and drive shaft to the drive. An alternative connecting disk adapted to be mounted to the pulley and drive shaft is also provided. This connecting disk has an indexing notch and an opening adapted to receive the keys 60 and the shaft simultaneously. This connecting disk also has a plurality of pin receiving orifices. The connecting disk is mounted to and spins with the pulley. The plate to which a pad is attached is formed in a manner like plates 32/33. The primary difference is that an indexing post is provided in addition to the pins, the key slots 62 and keys 60. The indexing post cooperates with the indexing notch to ensure proper alignment of the connecting disk with plate.

This invention has been described herein in considerable detail in order to comply with the patent statutes and to provide those skilled in the art with the information needed to apply the novel principles and to construct and use embodiments of the example as required. However, it is to be understood that the invention can be carried out by specifically different devices and that various modifications can be accomplished without departing from the scope of the invention itself.

What is claimed:

1. A floor treating machine comprising:
   a. a chassis adapted to be moved along the floor;
   b. a first variable speed motor affixed to the chassis and adapted to be coupled to and rotate a first disk in a first direction, said first disk including a first predetermined number of magnets, said first predetermined number of magnets identifying the type of disk coupled to the first motor;
   c. a first Hall sensor adapted to generate a first voltage signal based on the first predetermined number of magnets of the first disk coupled to the first variable speed motor; and
   d. a controller coupled to the first Hall sensor and the first variable speed motor, said controller adapted to control the speed of the first variable speed motor based on said first voltage signal generated by the first Hall sensor.

2. The floor treating machine of claim 1 further comprising a second variable speed motor affixed to the chassis and adapted to be coupled to and rotate a second disk.

3. The floor treating machine of claim 2 wherein said second variable speed motor rotates said second disk in a second direction.

4. The floor treating machine a claim 2 wherein said second disk includes a second predetermined number of magnets identifying the type of second disk coupled to the second variable speed motor.

5. The floor treating machine of claim 4 further comprising a second Hall sensor adapted to generate and send to the controller a second voltage signals based on the second predetermined number of magnets of the second disk coupled to the second variable speed motor, and wherein the controller is adapted to control the speed of the second variable motor based on the second voltage signal received from the second Hall sensor.

6. The floor treating machine of claim 5 wherein the controller shuts off the first variable speed motor and the second variable speed motor if the first voltage signal generated by the first Hall sensor and the second voltage signal received from the second Hall sensor are not substantially the same.

7. A floor treating machine comprising:
   a. a chassis adapted to be moved along the floor;
   b. a first variable speed motor affixed to the chassis and adapted to be coupled to and rotate a first disk in a first direction, said first disk including a first predetermined number of magnets;
   c. a second variable speed motor affixed to the chassis and adapted to be coupled to and rotate a second disk in a second direction, said second disk including a second predetermined number of magnets;
   d. a first Hall sensor adapted to generate a first voltage signal based on the first predetermined number of magnets of the first disk coupled to the first motor;
   e. a second Hall sensor adapted to generate a second voltage signal based on the second predetermined number of magnets of the second disk coupled to the second motor;
   f. a controller coupled to the first variable speed motor, the second variable speed motor, the first Hall sensor and the second Hall sensor, said controller adapted to control the speeds of the first variable speed motor and the second variable speed motor based on the voltage signals received from the first Hall sensor and the second Hall sensor.

8. The floor treating machine of claim 7 wherein the controller shuts off the first variable speed motor and the second variable speed motor if the first voltage signal and the second voltage signal are not substantially the same.

9. The floor treating machine of claim 1 wherein, when said first predetermined number of magnets includes at least two magnets, said first predetermined number of magnets are spaced about the first disk so there is a longer interval and at least one shorter interval between the magnets of said first predetermined number of magnets.

10. The floor treating machine of claim 9 wherein, when said second predetermined number of magnets includes at least two magnets, said second predetermined number of magnets are spaced about the second disk so that there is a longer interval and at least one shorter interval between the magnets of said second predetermined number of magnets.

\* \* \* \* \*